(12) United States Patent
Kim

(10) Patent No.: US 7,691,704 B2
(45) Date of Patent: Apr. 6, 2010

(54) METHOD FOR MANUFACTURING SEMICONDUCTOR DEVICE HAVING DAMASCENE MIM TYPE CAPACITOR

(75) Inventor: Seon-Heui Kim, Chungcheongbuk-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 166 days.

(21) Appl. No.: 11/875,451

(22) Filed: Oct. 19, 2007

(65) Prior Publication Data

US 2008/0105980 A1 May 8, 2008

(30) Foreign Application Priority Data

Nov. 3, 2006 (KR) .................. 10-2006-0108518

(51) Int. Cl.
*H01L 21/8242* (2006.01)
(52) U.S. Cl. .............. 438/243; 438/239; 438/241; 438/250; 438/393; 438/622; 438/623; 438/624; 438/631; 438/740; 257/758; 257/E23.01; 257/E21.295
(58) Field of Classification Search .......... 438/239, 438/241, 243, 250, 393, 622–624, 631; 257/758, 257/E21.495, E23.01
See application file for complete search history.

(56) References Cited

U.S. PATENT DOCUMENTS 6,413,815 B1 * 7/2002 Lai et al. .................. 438/243

2005/0258512 A1 * 11/2005 Tu .............................. 257/534

FOREIGN PATENT DOCUMENTS

KR 1020060037140 A 5/2006

\* cited by examiner

*Primary Examiner*—Charles D Garber
*Assistant Examiner*—Yasser A Abdelaziez
(74) *Attorney, Agent, or Firm*—Sherr & Vaughn, PLLC

(57) ABSTRACT

A method for manufacturing a semiconductor device having a damascene metal/insulator/metal (MIM)-type capacitor and metal lines including providing a semiconductor device; sequentially forming a first interlayer insulating film and a second interlayer insulating film over the semiconductor substrate; simultaneously forming a vias hole and a lower metal line in a line region and a lower electrode in a capacitor region, wherein the lower metal line and the lower electrode are electrically connected to the semiconductor device; sequentially forming a dielectric film, a third interlayer insulating film, a fourth interlayer insulating film and a fifth interlayer insulating film over the semiconductor substrate; and then simultaneously forming a plurality of upper electrodes, a plurality of second vias holes and a plurality of second upper metal lines in the capacitor region electrically connected to the plurality of upper electrodes, a plurality of third vias holes and a plurality of second upper metal lines in the capacitor region electrically connected to the lower electrode, and a plurality of fourth vias holes and a plurality of fourth upper metal lines in the line region electrically connected to the lower metal line.

14 Claims, 5 Drawing Sheets

Figure 1:
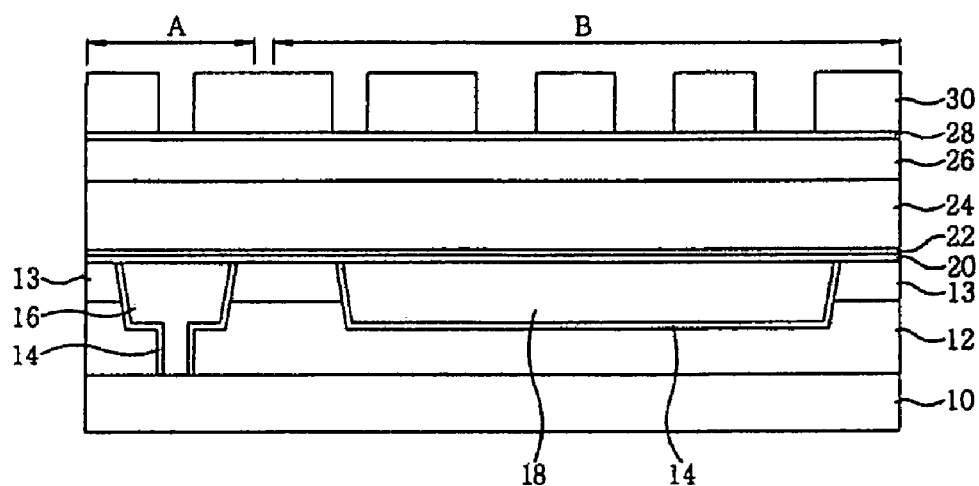

METHOD FOR MANUFACTURING SEMICONDUCTOR DEVICE HAVING DAMASCENE MIM TYPE CAPACITOR

The present application claims priority under 35 U.S.C. 119 to Korean Patent Application No. 10-2006-0108518 (filed on Nov. 3, 2006), which is hereby incorporated by reference in its entirety.

BACKGROUND

Aspects of semiconductor manufacturing have focused upon high-speed circuits to obtain a capacitor having a high capacitance. High-capacitance capacitors having a polysilicon/insulator/polysilicon (PIP) structure may be disadvantageous in that capacitance may be reduced as a result of the formation of a natural oxide film due to oxidation occurring at an interface between an upper electrode and a dielectric film and an interface between a lower electrode and the dielectric film. Such oxidation may occur due to the upper and lower electrodes being composed of polysilicon.

In order to eliminate this drawback, a capacitor having an MIM structure has been proposed for applications in semiconductor devices requiring a high Q value. The MIM structure may exhibit a low specific resistance and a low parasitic capacitance caused by an internal depletion. The MIM type capacitor may be connected to a metal line arranged around the MIM type capacitor, or may be connected to source/drain regions of a transistor via contact plugs. Where a highly-integrated semiconductor device using such an MIM type capacitor is manufactured, a damascene process may be used to form a plurality of electrodes and a plurality of lines for the capacitor, in place of an etching process. The damascene process may involve patterning an interlayer insulating film to form capacitor electrodes or lines regions, namely, trenches; gap-filling a metal material in the trenches, and planarizing the metal material using a chemical mechanical polishing (CMP) method. The MIM capacitor may be formed between a first metal line composed of copper and a second metal line in order to eliminate the interlayer insulating film planarizing process.

However, such a method of forming a capacitor may be disadvantageous since it may be necessary to use a mask for the formation of the MIM capacitor, and an additional mask for the formation of the line structure, which in turn, increases overall manufacturing costs.

SUMMARY

An object of the present invention is to provide a method for manufacturing a semiconductor device having a damascene MIM type capacitor, in which a plurality of metal lines and a MIM capacitor electrodes are formed, using two separate mask processes, such that the mask process for defining trenches/via holes for the metal line and the mask process for defining electrodes of the capacitor are simultaneously conducted, thereby reducing the number of mask processes and the number of manufacturing processes used to completely form the semiconductor device.

Embodiments relate to a method for manufacturing a semiconductor device including at least one of the following steps: providing a semiconductor substrate formed with a semiconductor device; sequentially forming a first interlayer insulating film and a second interlayer insulating film over the semiconductor substrate; etching the first interlayer insulating film and the second interlayer insulating film to form a plurality of trenches and a plurality of holes; simultaneously forming a lower line and a lower electrode by filling a metal material in the trenches and the holes; laminating a dielectric film and a third interlayer insulating film over the second interlayer insulating film; forming a plurality of vias holes and openings etching the third interlayer insulating film using a mask; filling a gap-fill film in the via holes and in the openings; etching the third insulating film and the gap-fill film in regions where the via holes are arranged, using a mask for defining a line region, to form a plurality of trenches; removing the gap-fill film and the dielectric film in regions exposed through the trenches, while removing the gap-fill film from the openings; and then filling a metal material in the trenches and the via holes, and in the openings, planarizing the filled metal, to form a plurality of vias holes and an upper line connected to the lower line in the trenches and the via holes, and simultaneously forming a plurality of upper electrodes over the dielectric film in the openings.

Embodiments relate to a method for manufacturing a semiconductor device including at least one of the following steps: providing a semiconductor device; sequentially forming a first interlayer insulating film and a second interlayer insulating film over the semiconductor substrate; simultaneously forming a vias hole and a lower metal line in a line region and a lower electrode in a capacitor region, wherein the lower metal line and the lower electrode are electrically connected to the semiconductor device; sequentially forming a dielectric film, a third interlayer insulating film, a fourth interlayer insulating film and a fifth interlayer insulating film over the semiconductor substrate; simultaneously forming a plurality of upper electrodes, a plurality of second vias holes and a plurality of second upper metal lines in the capacitor region electrically connected to the plurality of upper electrodes, a plurality of third vias holes and a plurality of second upper metal lines in the capacitor region electrically connected to the lower electrode, and a plurality of fourth vias holes and a plurality of fourth upper metal lines in the line region electrically connected to the lower metal line.

Embodiments relate to a semiconductor device including a semiconductor substrate having a line region and a capacitor region; a first insulating interlayer film formed over the semiconductor substrate; a second insulating interlayer film formed over the semiconductor substrate including the first insulating interlayer film; a lower electrode provided in the capacitor region including the first insulating interlayer film and the second insulating interlayer film; a dielectric film formed over the semiconductor substrate including the second insulating interlayer film and the lower electrode; a third insulating interlayer film formed over the semiconductor substrate including the dielectric film; a fourth insulating interlayer film formed over the semiconductor substrate including the third insulating interlayer film; a fifth insulating interlayer film formed over the semiconductor substrate including the fourth insulating interlayer film; a plurality of upper electrodes provided in the capacitor region including the third, fourth and fifth insulating interlayer films; an etch stop film formed over the semiconductor substrate including the fifth insulating interlayer film and the plurality of upper electrodes; a sixth insulating interlayer film formed over the semiconductor substrate including the etch stop film; a seventh insulating interlayer film formed over the semiconductor substrate including the sixth insulating interlayer film; an eighth insulating interlayer film formed over the semiconductor substrate including the seventh insulating interlayer film; a plurality of first metal lines extending through the line region; a plurality of second metal lines extending through the capacitor region electrically connected to the lower electrode; and a plurality of third metal lines extending through the capacitor region electrically connected to the plurality of upper electrodes.

DRAWINGS

Example FIGS. 1 to 9 illustrate a method for manufacturing a semiconductor device having a damascene metal/insulator/metal (MIM) type capacitor, in accordance with embodiments.

DESCRIPTION

As illustrated in example FIG. 1, a semiconductor device manufacturing process can be performed on and/or over silicon semiconductor substrate 10. Thereafter, first interlayer insulating film 12 and second interlayer insulating film 13 can be formed on and/or over semiconductor substrate 10. First interlayer insulating film 12 and second interlayer insulating film 13 may be formed by depositing at least one of undoped silicate glass (USG) film, a borosilicate glass (BSG) film, a phosphosilicate glass (PSG) film, a borophosphosilicate glass (BPSG) film, and a high density plasma (HDP)-oxide film, etc, using a chemical vapor deposition (CVD) process.

First interlayer insulating film 12 and second interlayer insulating film 13 can then be etched to form a trench and a contact hole for the formation of a lower line in line region A. A trench can be simultaneously formed for the formation of lower electrode 18 of a capacitor in capacitor region B.

A metal, such as copper (Cu), can be gap-filled in the trench or contact hole using an electroplating process. Thereafter, the metal on the surface of second interlayer insulating film 13 can be removed using a CMP process, to form a contact and line 16 connected to a lower semiconductor device via the trench and contact hole in line region A. Before the gap-filling of the metal, a thin barrier metal film 14 composed of titanium (Ti)/titanium nitride (TiN) multilayer may be deposited in the trench (or contact hole).

Dielectric film 20 composed of silicon nitride (SiN) or $T_2O_5$ can be deposited having a predetermined thin thickness on and/or over the overall portion of the planarized upper surface in line region A and capacitor region B. Dielectric film 20 may exhibit an etch selectivity to other interlayer insulating films.

Thereafter, third interlayer insulating film 22, fourth interlayer insulating film 24, and fifth interlayer insulating film 26 can be sequentially formed on and/or over dielectric film 20. First anti-reflective coating (ARC) layer 28 composed of silicon oxide nitride (SiON) can then be deposited over the resulting structure using a photolithographic process. Third interlayer insulating film 22, fourth interlayer insulating film 24, and fifth interlayer insulating film 26 may be formed in accordance with the deposition of an insulating film, such as an HDP-oxide film, a spin-on-glass (SOG) film, or a fluoro silicate glass (FSG) film, using a chemical vapor deposition (CVD) process.

Thereafter, a plurality of photoresist patterns 30 can then be formed on and/or over the resulting structure using a photolithographic process. Photoresist patterns 30 can be formed by coating a photoresist material on and/or over the overall surface of first ARC layer 28, and performing light exposure and development processes for the coated photoresist material, using a mask defining regions for a contact for a line, a dielectric film and a plurality of upper electrodes of the capacitor.

Figure 2:
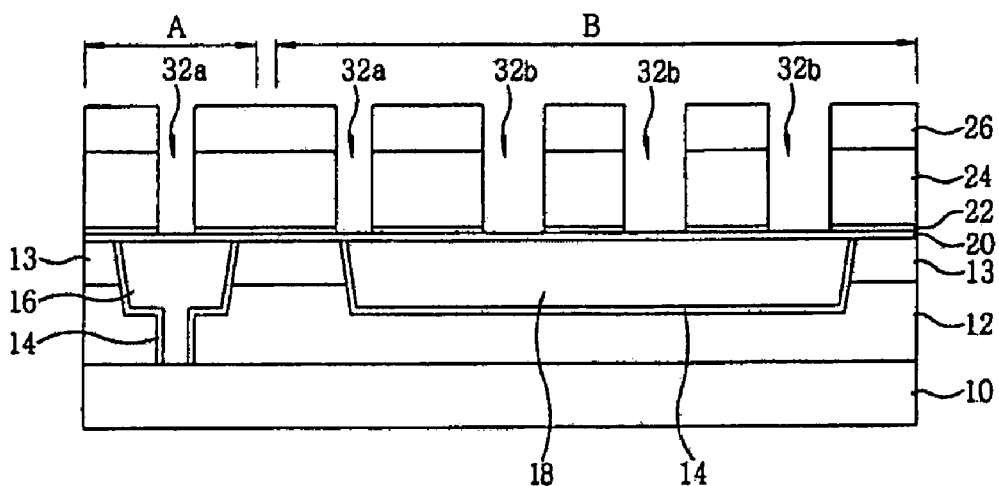

As illustrated in example FIG. 2, a portion of the uppermost surface of ARC film 28 may be exposed. Portions of third interlayer insulating film 22, fourth interlayer insulating film 24, and fifth interlayer insulating film 26, disposed beneath the exposed uppermost surface of ARC film 28 can be sequentially etched using a dry etching process, to form via holes 32a in line region A and openings 32b in capacitor region B. Thereafter, an ashing and etching process can be conducted to remove photoresist patterns 30 and ARC film 28. As a result, the uppermost surface of dielectric film 20 can be exposed through via holes 32a and openings 32b.

Figure 3:
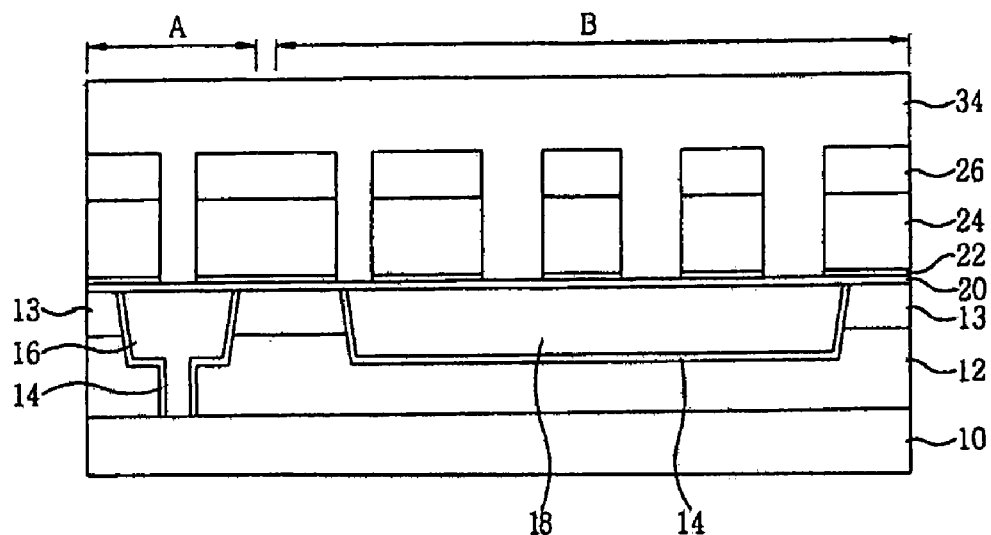

As illustrated in example FIG. 3, a first gap-fill layer 34 composed of an organic ARC film can then be deposited on and/or over the resulting structure to completely gap-fill via holes 32a and openings 32b.

Figure 4:
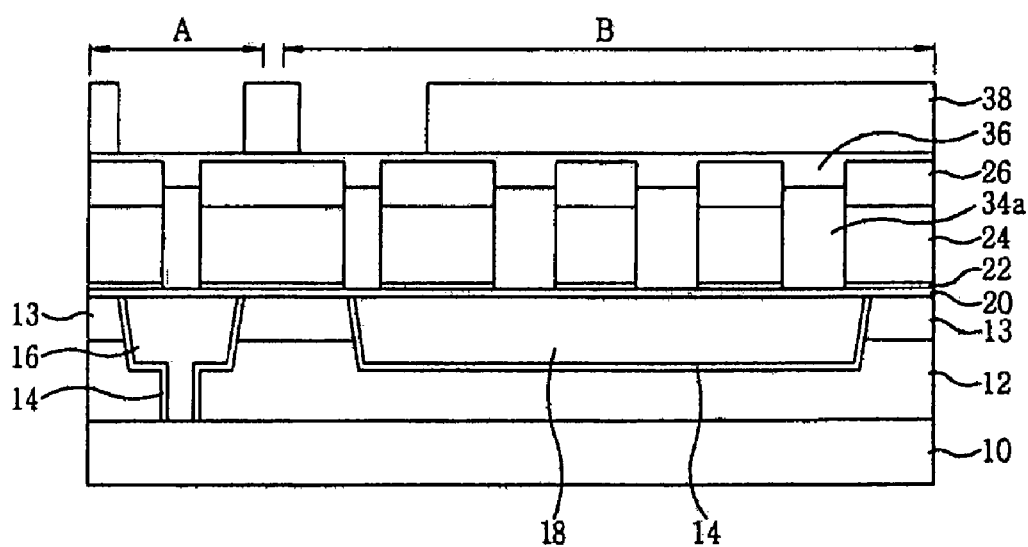

As illustrated in example FIG. 4, first gap-fill layer 34 can then be recess-etched in order that remaining gap-fill layer 34a remains in via-holes 32a and openings 32b. The thickness of remaining gap-fill layer 34a is such that the uppermost surface of remaining first gap-fill layer 34a can be lower than the uppermost surface of fourth interlayer insulating film 24 or fifth interlayer insulating film 26.

Thereafter, second ARC film 36 can be deposited on and/or over the resulting structure such that it completely covers via holes 32a and openings 32b. A photoresist material can then be coated on and/or over second ARC film 36. Light exposure development processes can be carried out on the coated photoresist material, using a mask defining a trench of line region A. Thus, a plurality of photoresist patterns 38 can be formed in line region A and capacitor region B.

Figure 5:
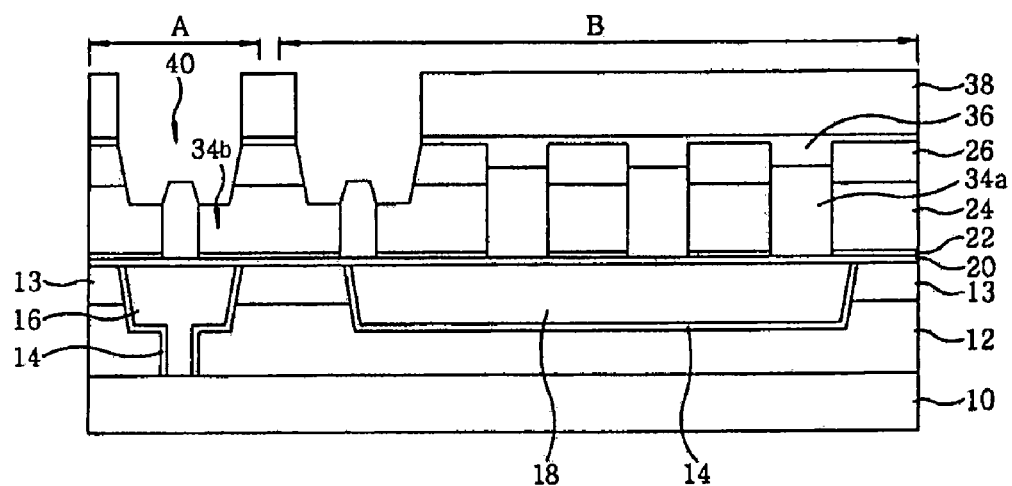

As illustrated in example FIG. 5, the exposed uppermost surfaces of second ARC film 36, fifth interlayer insulating film 26 and fourth interlayer insulating film 24 exposed through photoresist pattern 38, can be sequentially etched using a dry etching process to form trench 40. Through trench 40, first gap-fill film 34b, which has been etched to a predetermined thickness can be exposed.

Figure 6:
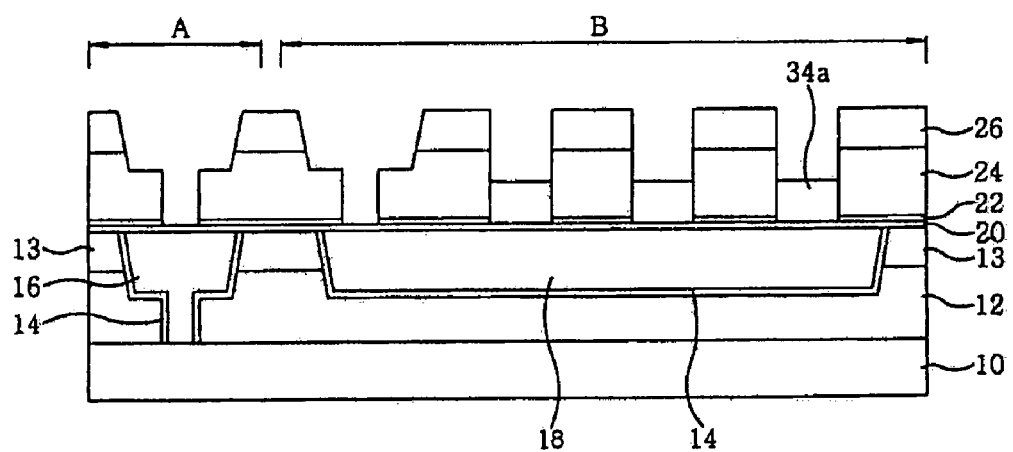

As illustrated in example FIG. 6, an ashing process can be subsequently conducted to remove photoresist pattern 38. Second ARC film 36 can be removed from capacitor region B using a wet etching process. Thereafter, first gap-fill film 34a can be removed from line region A and capacitor region B using a wet etching process.

Because first gap-fill film 34a has a predetermined topology between line region A and capacitor region B, the etching process for first gap-fill film 34a can be conducted until first gap-fill film 34a is completely removed from capacitor region B.

Figure 7:
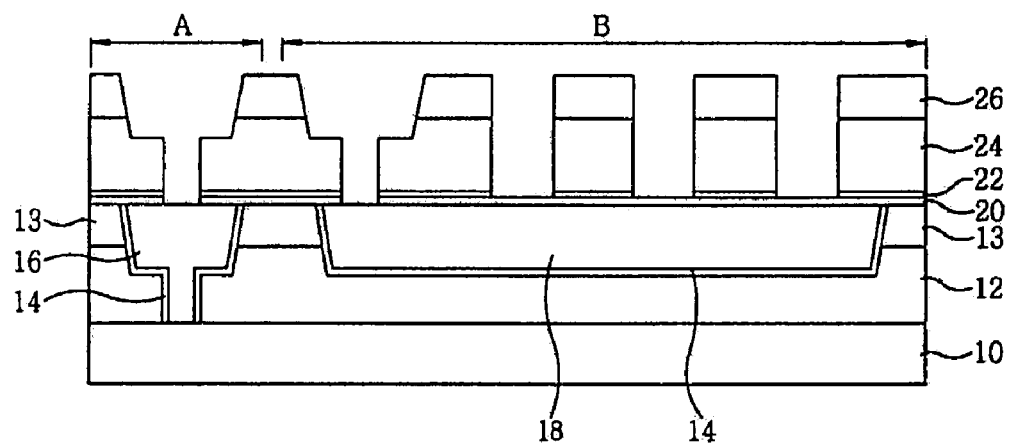

As illustrated in example FIG. 7, the portions of dielectric film 20 exposed through via holes 32a in line region A and capacitor region B can be removed. Thus, dielectric film 20 remains only in the remaining openings 32b of capacitor region B.

In accordance with embodiments, a plurality of trench and via holes can be formed in line region A and capacitor region B, to expose the uppermost surface of the lower line. Also, openings exposing the uppermost surface of dielectric film 20 can be formed in capacitor region B.

Figure 8:
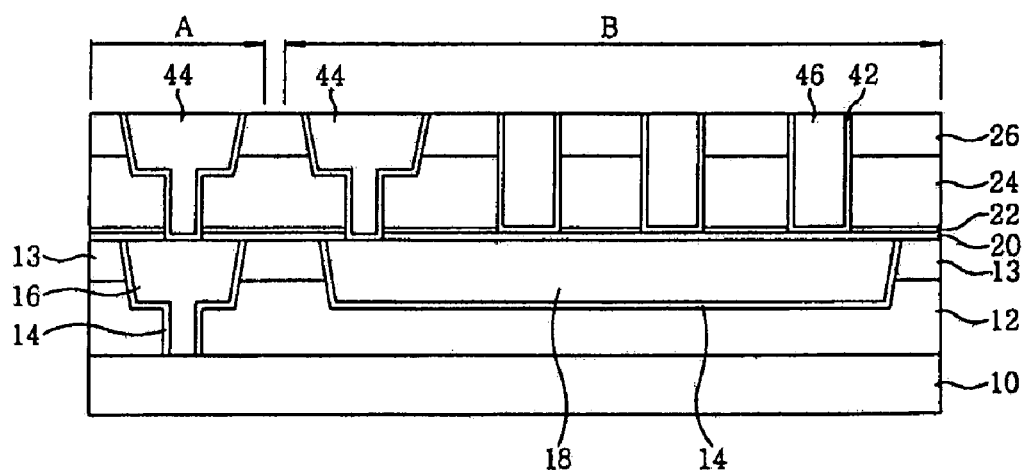

As illustrated in example FIG. 8, barrier metal film 42 composed of a multilayer Ti/TiN layer can then be deposited having a small thickness in the trench, via holes, and openings in capacitor region B. A metal, such as copper (Cu), can then be gap-filled in the trench (or contact hole) and openings using an electroplating process. The metal film disposed over fifth interlayer insulating film 26 can then be removed using a CMP process, to planarize barrier metal film 42a.

Thus, vias holes and upper line 44 can be formed such that they are electrically connected to lower line 16 and lower electrode 18 of the capacitor through the trench and via holes formed in line region A and a portion of capacitor region B, respectively. Simultaneously, upper electrodes 46 of the capacitor can be formed in the capacitor region B.

In accordance with embodiments, although the lines and the lower and upper electrodes of the capacitor have been described as being formed using a metal material such as copper using an electroplating process, it can be appreciated by a person skilled in the art that these structures may alternatively be formed by depositing a metal material such as at least one of TiN, TaN, W, WN, WSi, Ru, $RuO_2$, Ir, $IrO_2$, or Pt, using a physical vapor deposition (PVD) process.

The method for manufacturing a semiconductor device having a damascene MIM type capacitor in accordance with embodiments, the metal lines and the electrodes can be simultaneously formed using a primary mask process for defining the via holes of the metal lines and the openings of the capacitor, and a secondary mask process for defining the trenches of the metal lines. Particularly, the method in accordance with embodiments may involve performing the primary mask process, forming a gap-fill film and an ARC film on and/or over an interlayer insulating film in the via holes and openings, performing a trench etching process using a secondary mask, and removing the ARC film and gap-fill film from metal line region A and capacitor region B, to form via hole and trench structures in the interlayer insulating film in metal line region A and capacitor region B while forming openings in the interlayer insulating film in capacitor region B.

Accordingly, the overall number of photolithographic processes using any mask and the total number of manufacturing processes can be reduced because it is possible to perform a damascene process, without separately performing mask processes for defining trench/via hole structures for metal lines and openings for capacitor electrode regions.

Figure 9:
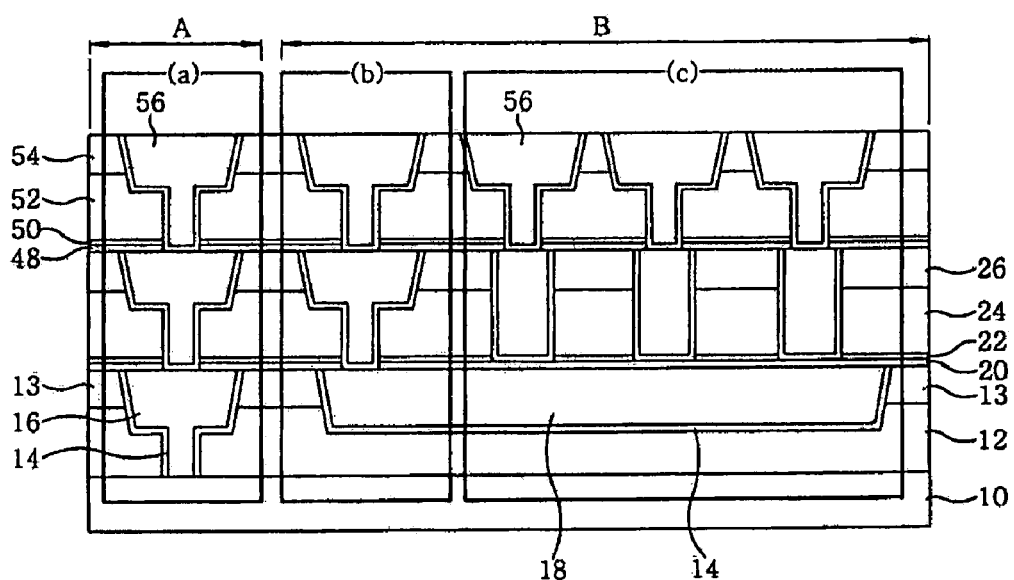

As illustrated in example FIG. 9, a general multilayer metal line structure (a) of the semiconductor device, metal line structure (b) connected to the lower electrode of the capacitor, and metal line structure (c) connected to the upper electrodes of the capacitor. First interlayer insulating film 12 and second interlayer insulating film 13 can be sequentially laminated on and/or over semiconductor substrate 10, which has been formed with a semiconductor device such as a MOS transistor. The contact and line 16, which can be connected to the lower semiconductor device formed under first interlayer insulating film 12 and second interlayer insulating film 13 in line region A can be formed. Also, lower electrode 18 of the capacitor which is connected to the lower semiconductor device formed under first insulating film 12 and second interlayer insulating film 13 in capacitor region B can be formed.

Third interlayer insulating film 22, fourth interlayer insulating film 24, and fifth interlayer insulating film 26 can be sequentially laminated on and/or over semiconductor substrate 10. Via holes and lines 44 can be formed and can be vertically connected to lines 16 through third interlayer insulating film 22, fourth interlayer insulating film 24 and fifth interlayer insulating film 26 in line region A and in region (b) of capacitor region B. In the same layer structure as described above, lower electrode 18, dielectric film 20 and upper electrodes 46 of capacitor are formed through third interlayer insulating film 22, fourth interlayer insulating film 24 and fifth interlayer insulating film 26 in capacitor region B.

Etch stop film 48, sixth interlayer insulating film 50, seventh interlayer insulating film 52, and eighth interlayer insulating film 54 are sequentially laminated on and/or over semiconductor substrate 10, namely the remaining structure formed thereon and/or thereover. Vias holes and upper lines 56, which are vertically connected to lower lines 44 and upper electrodes 46 of the capacitor, respectively, can be formed in line region A and region (b) capacitor region B through etch stop film 48, sixth interlayer insulating film 50, seventh interlayer insulating film 52 and eighth interlayer insulating film 54.

In accordance with embodiments, a method for manufacturing a semiconductor device which may include performing a primary mask process for defining via holes for a plurality of metal lines and openings for a capacitor, forming a gap-fill film and an anti-reflective coating (ARC) film on and/or over a plurality of interlayer insulating films of the via holes and openings, etching trenches for the metal lines using a secondary mask, and removing the ARC film and gap-fill film from a metal line region and a capacitor region to form via hole and trench structures in the interlayer insulating films in the metal line region and the capacitor region while forming openings in the interlayer insulating films in the capacitor region.

Accordingly, the number of photolithography processes using masks and the total number of manufacturing processes can be reduced because it is possible to perform a damascene process, without separately performing mask processes for defining trench/via hole structures for metal lines and openings for capacitor electrode regions.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
providing a semiconductor substrate formed with a semiconductor device;
sequentially forming a first interlayer insulating film and a second interlayer insulating film over the semiconductor substrate;
etching the first interlayer insulating film and the second interlayer insulating film to form a plurality of trenches and a plurality of holes;
simultaneously forming a lower line and a lower electrode by filling a metal material in the trenches and the holes;
laminating a dielectric film and a third interlayer insulating film over the second interlayer insulating film;
forming a plurality of vias holes and openings etching the third interlayer insulating film using a mask;
filling a gap-fill film in the via holes and in the openings;
etching the third insulating film and the gap-fill film in regions where the via holes are arranged, using a mask for defining a line region, to form a plurality of trenches;
removing the gap-fill film and the dielectric film in regions exposed through the trenches, while removing the gap-fill film from the openings; and
filling a metal material in the trenches and the via holes, and in the openings, planarizing the filled metal, to form a plurality of vias holes and an upper line connected to the lower line in the trenches and the via holes, and simultaneously forming a plurality of upper electrodes over the dielectric film in the openings.

2. The method of claim 1, wherein the dielectric film comprises a material having an etch selectivity to the interlayer insulating films.

3. The method of claim 1, wherein the third interlayer insulating film comprises at least one insulating film.

4. The method of claim 1, further comprising:
filling an anti-reflective coating film on the gap-fill film in the via holes and in the openings.

5. The method of claim 1, further comprising:
forming a barrier metal film in the trenches, the via holes and the openings, before filling a metal in the trenches, the via holes and the openings formed by partially etching the gap-fill film.

6. A method comprising:
providing a semiconductor device;
sequentially forming a first interlayer insulating film and a second interlayer insulating film over the semiconductor substrate;
simultaneously forming a vias hole and a lower metal line in a line region and a lower electrode in a capacitor region, wherein the lower metal line and the lower electrode are electrically connected to the semiconductor device;
sequentially forming a dielectric film, a third interlayer insulating film, a fourth interlayer insulating film and a fifth interlayer insulating film over the semiconductor substrate; and then
simultaneously forming a plurality of upper electrodes, a plurality of second vias holes and a plurality of second upper metal lines in the capacitor region electrically connected to the plurality of upper electrodes, a plurality of third vias holes and a plurality of second upper metal lines in the capacitor region electrically connected to the lower electrode, and a plurality of fourth vias holes and a plurality of fourth upper metal lines in the line region electrically connected to the lower metal line.

7. The method of claim 6, further comprising the step of sequentially forming an etch stop film, a sixth insulating interlayer film, a seventh insulating interlayer film and an eighth insulating interlayer film over the semiconductor substrate prior to simultaneously forming the plurality of upper electrodes, the plurality of second, third and fourth vias holes and the plurality of second, third and fourth upper metal lines.

8. The method of claim 6, wherein the step of simultaneously forming a vias hole and a lower metal line in a line region and a lower electrode in a capacitor region comprises:
simultaneously forming a trench and a contact hole in the line region and a plurality of trenches and plurality of contact holes in the capacitor region; and then
forming a first barrier metal film in the trench and the contact hole in the line region and the plurality of trenches and plurality of contact holes in the capacitor region.

9. The method of claim 8, wherein simultaneously forming the trench and the contact hole in the line region and the plurality of trenches and plurality of contact holes in the capacitor region is performed by etching the first interlayer insulating film and the second interlayer insulating film.

10. The method of claim 9, wherein the lower metal line and the lower electrode are formed by gap-filling a metal in the trenches and contact holes using an electroplating process.

11. The method of claim 8, wherein the barrier metal film is composed of a titanium/titanium nitride multilayer.

12. The method of claim 6, wherein the third interlayer insulating film, the fourth interlayer insulating film and the fifth interlayer insulating film are formed by depositing at least one of HDP-oxide, spin-on-glass and fluoro silicate glass using a chemical vapor deposition process.

13. The method of claim 6, wherein the metal lines, the upper electrodes and the lower electrode comprise at least of Cu, TiN, TaN, W, WN, WSi, Ru, $RuO_2$, Ir, $IrO_2$ and Pt.

14. The method of claim 6, wherein the first interlayer insulating film and the second interlayer insulating film are formed using a chemical vapor deposition process.

* * * * *